(12) United States Patent
Flaherty et al.

(10) Patent No.: US 10,171,025 B2
(45) Date of Patent: Jan. 1, 2019

(54) APPARATUS AND METHOD FOR SOLAR PANEL MODULE MOUNTING INSERTS

(71) Applicant: LUMETA, LLC, Irvine, CA (US)

(72) Inventors: Brian J. Flaherty, Alamo, CA (US); Erwang Mao, Palo Alto, CA (US); Joseph P. Kaveney, Alameda, CA (US)

(73) Assignee: LUMETA, LLC, Irvine, CA (US)

( * ) Notice: Subject to any disclaimer, the term of this patent is extended or adjusted under 35 U.S.C. 154(b) by 224 days.

(21) Appl. No.: 14/794,199

(22) Filed: Jul. 8, 2015

(65) Prior Publication Data

US 2017/0012573 A1    Jan. 12, 2017

(51) Int. Cl.
*H01L 31/044* (2014.01)
*H02S 20/23* (2014.01)
*H01L 31/047* (2014.01)

(52) U.S. Cl.
CPC ............ *H02S 20/23* (2014.12); *H01L 31/047* (2014.12); *Y02B 10/12* (2013.01)

(58) Field of Classification Search
CPC ....... H01L 31/00–31/078; Y02E 10/50–10/60; H02S 20/00–20/32
USPC .................................................. 136/243–265
See application file for complete search history.

(56) References Cited

U.S. PATENT DOCUMENTS

| | | | |
|---|---|---|---|
| 3,769,091 A | 10/1973 | Leinkram et al. | |
| 4,677,248 A * | 6/1987 | Lacey | F24J 2/5211 126/569 |
| 5,505,788 A * | 4/1996 | Dinwoodie | F24J 2/34 136/244 |
| 6,948,288 B1 | 9/2005 | Smith | |
| 7,178,295 B2 | 2/2007 | Dinwoodie | |
| 7,506,477 B2 | 3/2009 | Flaherty et al. | |
| 7,509,775 B2 | 3/2009 | Flaherty et al. | |
| 7,531,740 B2 | 5/2009 | Flaherty et al. | |
| 7,557,291 B2 | 7/2009 | Flaherty et al. | |

(Continued)

FOREIGN PATENT DOCUMENTS

| | | |
|---|---|---|
| DE | 20 2009 002440 U1 | 4/2009 |
| DE | 20 2009 010984 U1 | 12/2009 |

(Continued)

OTHER PUBLICATIONS

U.S. Appl. No. 14/454,226, filed Aug. 7, 2014, to Timothy Michael Davey et al.

(Continued)

*Primary Examiner* — Bach T Dinh

(74) *Attorney, Agent, or Firm* — Katten Muchin Rosenman LLP

(57) ABSTRACT

A photovoltaic module generates electrical power when installed on a roof. A photovoltaic module preferably has an upper transparent protective layer, and a photovoltaic layer positioned beneath the upper transparent protective layer, the photovoltaic layer comprising a plurality of electrically interconnected photovoltaic cells disposed in an array. A rigid substrate layer is preferably positioned beneath the photovoltaic layer. A plurality of inserts is configured to be fixedly attached to (i) a bottom surface of the rigid substrate and (ii) a surface of a roof. The plurality of inserts is preferably disposed in an array, each foam insert having a substantially triangular-shaped cross section when viewed from a side orthogonal to a line of a roof downward slope.

25 Claims, 15 Drawing Sheets

(56) References Cited

U.S. PATENT DOCUMENTS

| | | | |
|---|---|---|---|
| 8,186,111 B2 | 5/2012 | Flaherty et al. | |
| 2002/0026955 A1* | 3/2002 | Ouchida | H01L 31/03767 |
| | | | 136/251 |
| 2003/0154680 A1* | 8/2003 | Dinwoodie | H02S 20/23 |
| | | | 52/519 |
| 2005/0178428 A1 | 8/2005 | Laaly et al. | |
| 2006/0137733 A1* | 6/2006 | Schripsema | H01L 31/048 |
| | | | 136/246 |
| 2007/0266672 A1 | 11/2007 | Bateman et al. | |
| 2008/0029144 A1* | 2/2008 | Brazier | E04D 3/352 |
| | | | 136/206 |
| 2009/0044854 A1 | 2/2009 | Placer et al. | |
| 2011/0000535 A1 | 1/2011 | Davidson | |
| 2012/0110931 A1* | 5/2012 | Eiffert | F24J 2/5237 |
| | | | 52/173.3 |
| 2012/0240489 A1* | 9/2012 | Rivera | F24J 2/4638 |
| | | | 52/173.3 |
| 2015/0121779 A1* | 5/2015 | Arguelles | E04D 11/002 |
| | | | 52/173.1 |
| 2016/0105143 A1* | 4/2016 | Johansen | H02S 20/23 |
| | | | 248/237 |

FOREIGN PATENT DOCUMENTS

| | | |
|---|---|---|
| DE | 10 2009 037341 A1 | 2/2011 |
| EP | 1 958 944 A1 | 8/2008 |
| EP | 2 395 299 A1 | 12/2011 |
| WO | 96/00827 A1 | 1/1996 |

OTHER PUBLICATIONS

Transmittal; International Search Report; and the Written Opinion of the International Searching Authority for International Application No. PCT/US2015/039527 dated Mar. 22, 2016.

* cited by examiner

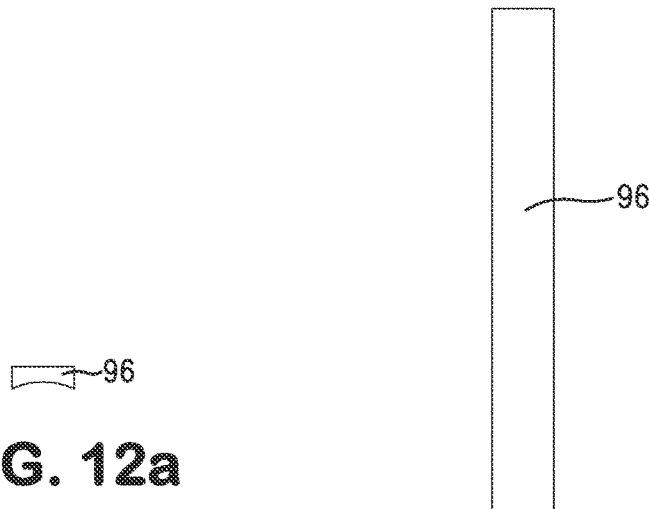
FIG. 12a
FIG. 12b
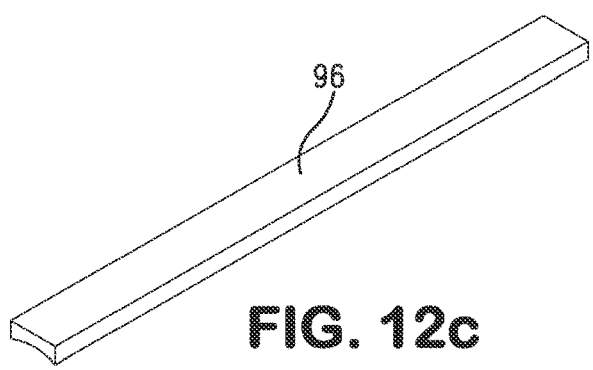
FIG. 12c
FIG. 12d

APPARATUS AND METHOD FOR SOLAR PANEL MODULE MOUNTING INSERTS

BACKGROUND OF THE INVENTION

1. Field of the Invention

The present invention relates to solar panels/modules for generating electrical energy, and more particularly to mounting inserts used to mount photovoltaic panels/modules to flat and/or profiled (for example, S-shaped) roof surfaces.

2. Description of the Related Art

Conventional photovoltaic modules for generating electrical power for residences and businesses are often flat and are placed on a portion of a roof that is exposed to the sun. Historically, such modules were placed on structures erected on the roof to support and protect the modules. More recently, photovoltaic modules have become available that can be mounted directly on a flat or tilted roof. See, for example, US Patent Application Publication No. 2005/0178428 A1 to Laaly et al., (the entire contents of which are incorporated herein by reference), which discloses a module that incorporates a roofing membrane into the module structure. The module is intended to be installed on a new roof or replacement roof with the membrane providing moisture protection for the underlying structure as well as providing electrical power.

See also U.S. Pat. Nos. 7,506,477; 7,509,775; 7,531,740; 7,557,291; and 8,186,111 to Flaherty, et al., the entire contents of each of which are incorporated herein by reference. These patents disclose such photovoltaic modules for roof-top installation.

A problem with above mentioned direct-rooftop-attached crystalline silicon photovoltaic cell based solar modules is their installation tends to be unwieldy. For example, U.S. patent application Ser. No. 14/454,226 (the entire contents of which are incorporated herein by reference) describes installing such modules directly on the roofs of residential and/or commercial establishments using double stick tape. This tape is installed on the bottom surface of the module and is adhered directly to the top surface of the roof. This process improves installation time remarkably, and has found much favor in the marketplace. Nevertheless, as shown in FIG. 1, there may be voids 10, 12, 14, and 16 between the bottom surface of the solar module 18 and the top surfaces of the shingles 1, 2, 3, and 4. Thus, the double stick tape (DST) on the bottom surface of the module 18 may not provide as much attachment as may be desired. This problem may be exacerbated when the roof comprises a profiled, S-shaped roof tile, for example shown in FIG. 1 of U.S. Pat. No. 8,186,111. In this case, the points of contact between the DST and the crests of the S-shaped tiles are even fewer. Thus, what is needed is a solar panel/module system that is quick and easy to install, and provides superior attachment to the roof surface.

SUMMARY OF THE INVENTION

The photovoltaic module described herein and illustrated in the attached drawings enables electricity-generating solar modules to be installed quickly and with reliable roof attachment.

In accordance with one aspect according to the present invention, a photovoltaic module has an upper transparent protective layer, and a photovoltaic layer positioned beneath the upper transparent protective layer, the photovoltaic layer comprising a plurality of electrically interconnected photovoltaic cells disposed in an array. A rigid substrate layer is positioned beneath the photovoltaic layer, and a plurality of foam inserts is configured to be fixedly attached to (i) the bottom surface of the rigid substrate and (ii) the surface of a roof. The plurality of foam inserts is disposed in an array, each foam insert having a substantially triangular-shaped cross section when viewed from a side orthogonal to a line of a roof downward slope.

In accordance with another aspect according to the present invention, a photovoltaic module has a substantially rectilinear panel having a top surface and a plurality of photovoltaic cells disposed in an array. An electrical device is disposed on the top surface substantially adjacent a first edge of the rectangular panel. At least one insulating insert is coupled between the bottom surface of the panel and the top surface of a roof. The at least one insert has a substantially triangular-shaped side cross section when viewed from a side orthogonal to a direction of a roof downward slope, such that a top flat surface of the at least one insert is coupled to the bottom surface of the panel, and a bottom surface of the at least one insert is coupled to the top surface of the roof.

In accordance with a further aspect according to the present invention, a photovoltaic module has a rectilinear panel having a top surface and a plurality of photovoltaic cells disposed in an array, all four edges of the panel being tapered. A 2×2 array of inserts is fixed to a bottom surface of the module, each insert of the array having a wedge shape with (i) a thinner end disposed toward a bottom of the module in a direction of a downward slope of the roof, and (ii) a thicker end disposed toward a top of the module in a direction opposite the downward slope of the roof.

In accordance with yet another aspect according to the present invention, a method of making a photovoltaic module includes (i) providing a rectilinear photovoltaic panel having a plurality of cells disposed therein; and (ii) attaching a plurality of foam inserts on a bottom surface of the module, each insert having a wedge shape with a top flat surface thereof affixed to the bottom of the module, the foam inserts being disposed in an array.

BRIEF DESCRIPTION OF THE DRAWINGS

Certain aspects in accordance with embodiments of the present invention are described below in connection with the accompanying drawing figures in which:

FIGS. 9a and 9d illustrate plan views of module insert supports according to the FIG. 7a embodiment;

FIGS. 12a, 12b, 12c, and 12d are, respectively, side, top plan, and perspective views of the module inserts according to the FIG. 11a embodiment.

DETAILED DESCRIPTION OF THE PREFERRED EMBODIMENTS

Briefly, the present invention proposes to provide a periodically-disposed array of insulating solar module inserts between the bottom surface of the solar module and the upper surface of the roof. The inserts will insulate against temperature and/or electrical variations, and are spaced so as to allow wind, water, and debris to pass freely. Preferably, different inserts may be used for differently-shaped roof products, such as composite shingles, any curved shaped one piece concrete or clay tile, any flat stone or slate shaped tile, any flat concrete or clay shaped tile, any two piece curved clay or concrete tiles, and/or any S-shaped concrete or clay tiles.

Figure 1:
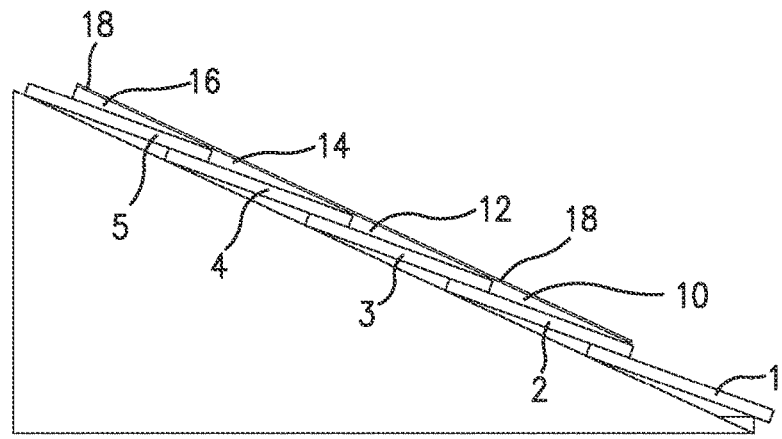
FIG. 1 illustrates a cross-sectional schematic showing a typical solar module roof installation according to the prior art.
Figure 2:
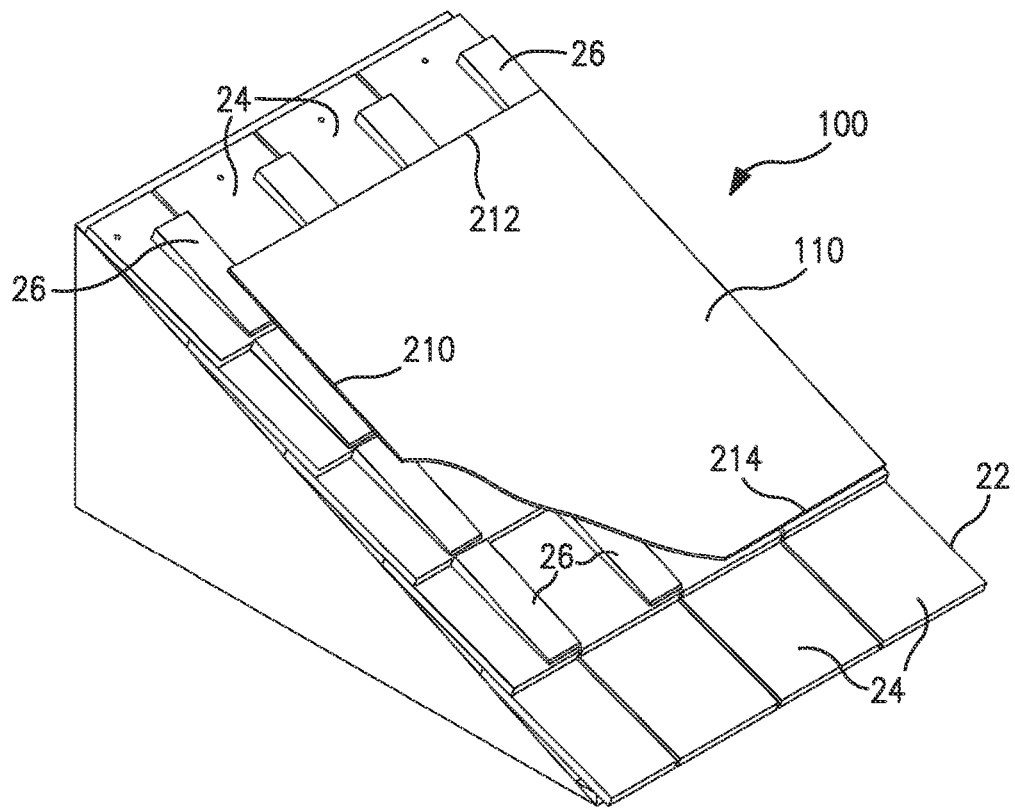
FIG. 2 illustrates a perspective view of a schematic representation of an embodiment according to the present invention.
Figure 3A:
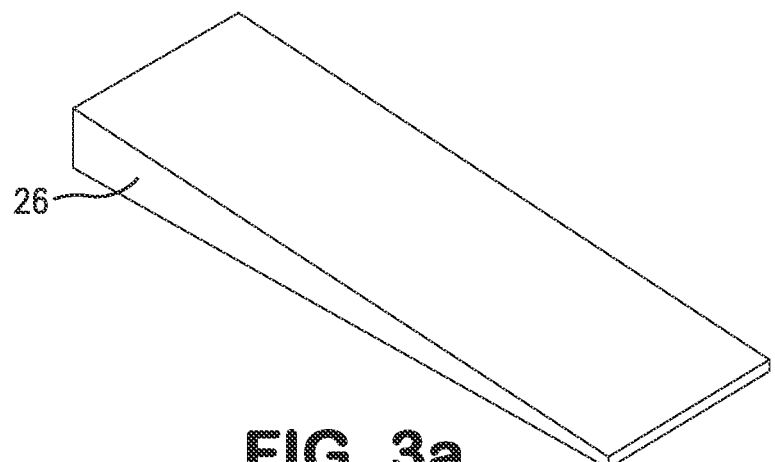
FIGS. 3a, 3b, 3c, and 3d illustrate, respectively, perspective, side, top plan, and end views of a solar module foam insert according to the FIG. 2 embodiment.
Figure 3B:
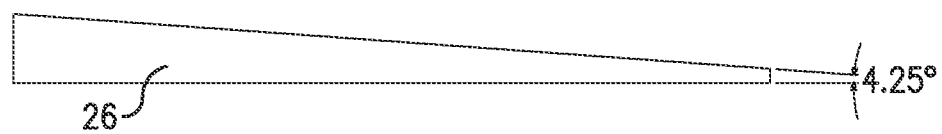
Figure 3C:
Figure 3D:
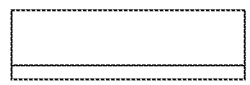

With reference to FIG. 2, a laminated photovoltaic module 100 is preferably configured as a generally square or rectangular module which is sized and shaped in accordance with the sizes and shapes of conventional building materials, such as a 4×8 foot module. Thus, the module 100 can be handled by a construction crew without requiring any special material handling equipment. Of course, the module 100 may be any convenient size (4×8, 4×4, 3×3, 3×2, 2×2, 2×1, 1×1, etc.), and shape (square, round, triangular, trapezoidal, etc.) useful in the construction industry, and with either rounded corners or substantially right angle corners. The module 100 is preferably assembled in a factory or other suitable environment so that the module 100 is complete and ready to install on a substantially flat roof (which may be horizontal or tilted), or sloped shingle roofs, such as, but not limited to, asphalt, laminated, wood, slate, concrete, or other location having adequate exposure to the sun. In one preferred embodiment, the module 100 has dimensions of approximately 101 centimeters (~40 inches) by 196 centimeters (~77 inches) and has a thickness of approximately 0.5 centimeter (0.2 inch). In another preferred embodiment, the module 100 has dimensions of approximately 101 centimeters (~40 inches) by 101 centimeters (~40 inches) and has a thickness of approximately 0.3 centimeter (⅛ inch) when installed. In fact, the thickness of the module is preferably the same as (or thinner than) the thickness of the laminated roofing shingle. Thus, the module 100 does not add significant height to a roof structure and will not block water flow on sloped roofs. In yet another embodiment, the module 100 has dimensions of approximately 101 centimeters (~40 inches) by 239 centimeters (~94 inches) and has a thickness of approximately 0.5 centimeter (0.2 inch). In a particularly preferred embodiment, the module has dimensions of 101 cm×120 cm×0.3 cm.

The module 100 preferably has a transparent upper protective layer that faces upward and is exposed to the sun. A middle layer is preferably positioned beneath the upper protective layer. The middle layer comprises a plurality of photovoltaic cells 122 (FIG. 4) electrically interconnected to form a photovoltaic array. The middle layer preferably rests on a rigid lower substrate. The middle layer is preferably secured to the rigid lower layer by a lower adhesive layer. The middle layer is preferably secured to the upper protective layer by an upper adhesive layer. The middle layer is thus encapsulated between the lower adhesive layer and the upper adhesive layer.

The upper protective layer preferably provides impact protection as well as weather protection to the module 100. The upper protective layer advantageously comprises of a transparent flexible polymer material, such as, but not limited to Ethylene tetrafluoroethylene (ETFE), a fluorine based co-polymer, which is formed into a film layer of suitable thickness (e.g., approximately 0.005-0.013 centimeter (0.002-0.005 inch)). Thus, the photovoltaic cells 122 in the middle layer are exposed to direct sunlight without being exposed to moisture and other climatic conditions and without being exposed to direct impact by feet, falling objects, and debris. Tempered glass having a suitable thickness may also be used as the upper protective layer 110.

The rigid lower layer substrate preferably comprises fiber reinforced plastic (FRP). For example, the FRP layer advantageously comprises a polyester resin with embedded stranded glass fibers. Preferably the said FRP layer has a thickness of approximately 0.1 centimeter to 1 centimeter (0.079 inch-0.39 inch), and additionally, the said FRP lower surface can be either flat or with a defined pattern/rib. The lower layer of FRP thus provides an advantageous combination of rigidity, light weight, very low permeability, and flatness.

The preferred embodiments provide that the photovoltaic cells 122 (FIG. 4) are electrically interconnected in a series-parallel configuration in a conventional manner to provide a suitable output voltage or a desired photovoltaic module form factor. For example, FIG. 2 shows a photovoltaic module suitable for flat roof application. Photovoltaic cells 122 are preferably arranged in 6 rows of 12 cells each; however, one, two, or more cells are preferably omitted from at least one of the edge rows to provide room for positioning an electrical enclosure, such as, but not limited to junction box 172 (FIG. 4) having a first weather-resistant electrical conductor and a second weather-resistant electrical conductor. The junction box 172 may comprise, for example, one or more of: module power optimizer, micro inverter, and other useful electrical control and/or power-conditioning circuitry. The photovoltaic module 100 preferably includes two module output conductors that extend from the top surface of the middle layer in the area of the omitted photovoltaic cell(s). Each of the module output conductors is preferably connected to a respective one of the weather-resistant electrical conductors within the electrical box or enclosure 172 after the photovoltaic module 100 is laminated. In an alternative embodiment, the junction box 172 may be mounted on the lower (underside) surface of the module 100 rather than on the upper surface thereof. In this embodiment, there are preferably no cells missing from the solar cell array.

FIG. 2 is a perspective view of a schematic representation of an embodiment according to the present invention fixed to a top surface of a substantially flat shingle and/or tile commercial or residential roof 22 comprising, for example, plural overlapping flat tile 24. The module 100 (shown with reduced dimensions in FIG. 2 for clarity) is fixed to plural inserts 26, which are preferably disposed in an array. As shown in FIGS. 3a, 3b, 3c, and 3d each insert 26 is preferably 13 inches long, by 4 inches wide, by 1.25 inches thick at the wide end—tapering down to 5/16 to 3/8 inch at the narrow end. Preferably, all six sides of each insert are flat, or 5 sides of each insert are flat and one side is concave. Preferably, the insert dimensions are substantially 4 inches wide by 14 (or 13.5 or 13 or 12.5 or 12 or 11.5 or 11 or 10.5 or 10 or 9.5 05 9.0 or 8.5 or 8.0, etc.) inches long. Of course, any size, shape, and dimensions may be adapted to the particular installation. For example, these wedge-shaped inserts 26 having a triangular cross-section may have dimensions of: is preferably 8 or 7½ or 7 or 6½ or 6 or 5½ or 5 or 4½ or 4 or 3 inches long, by 4 inches wide, by 2 or 1.75 or 1.5 or 1.25 or 1.0 or 0.75 or 0.5 or 3/8 or 5/16 or 1/4 inches thick at the wide end—tapering down to ½ or 7/16 or 3/8 or 5/16 or 1/4 or 3/16 or 1/8 or 1/16 inches at the narrow end. Preferably, each insert 24 is made of plastic foam, such as Expanded Polypropylene (EPP) The inserts 26 may also comprise any type of expanded polystyrene (EPS), any type of ridged plastic, metal, wood, concrete, glass, epoxy, silicone, cement or natural granite or rock. Preferably, the inserts have sufficient thickness so that no portion of the module 100 touches any portion of the roof surface.

Preferably, the inserts 26 are disposed in an array comprising, for example, 4 columns by 4 rows of inserts, with the vertical space between inserts being 1 or 1¼ inches, and the horizontal distance between inserts being 9 and ⅓ inches. The horizontal spacing and the thickness of the inserts are designed to allow water, wind, and debris to pass downward over the roof shingles. But, the orthogonal distance between the roof surface and the module bottom surface is maintained at about 1 inch to prevent wind blowing beneath the module bottom surface from generating a substantial lifting force which may lift the module off of the roof.

As can be seen in FIG. 2, the edges 210 and 212 of module 100 may be positioned so as to overly only a portion of the surface area of underlying insert 26. This portion may comprise one half, one third, one quarter, two thirds, three quarters, etc. For example, the top left insert 26 in FIG. 2 may be overlapped by only one quarter of its surface area. This overlapping arrangement allows side-by-side modules 100 to share inserts, and thus present a more stable and more visually pleasing array. Also, by assuring that the module edges are securely anchored on the inserts, the entire array will be more firmly anchored in high wind situations. The edges of the modules on the interior of the array are preferably overlapped in the manner described. Modules on one or more edges of the entire array, however, are preferably positioned so that their outermost module edges (i.e., at the array edges) are disposed right at the outermost edges of the underlying inserts (or overlapping the insert edges by one quarter, one half, three quarters, or one inch). Note that the bottom edge 214 of the lowermost module(s) in an array are preferably positioned at the lowermost edges of the underlying inserts, to allow for installation of birdstops (to be discussed below).

Figure 4:
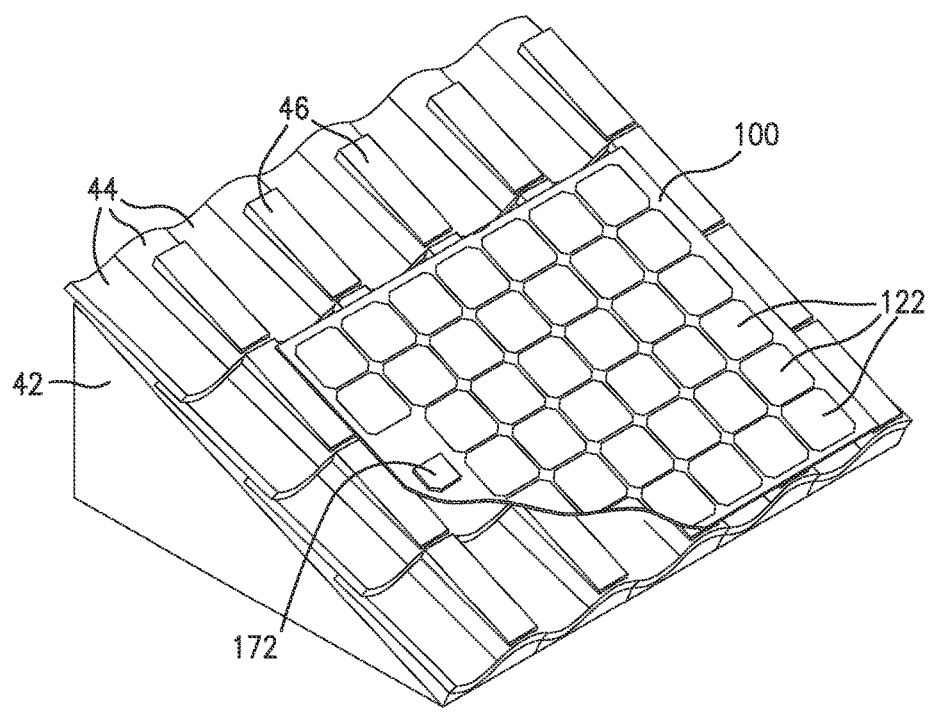
FIG. 4 illustrates a perspective view of a schematic representation of another embodiment according to the present invention.
Figure 5A:
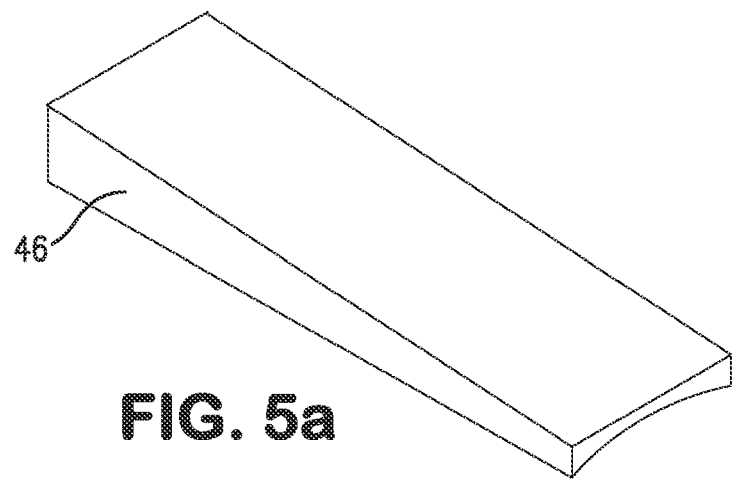
FIGS. 5a, 5b, 5c, and 5d illustrate, respectively, perspective, side, top plan, and end views of a solar module foam insert according to the FIG. 4 embodiment.
Figure 5B:
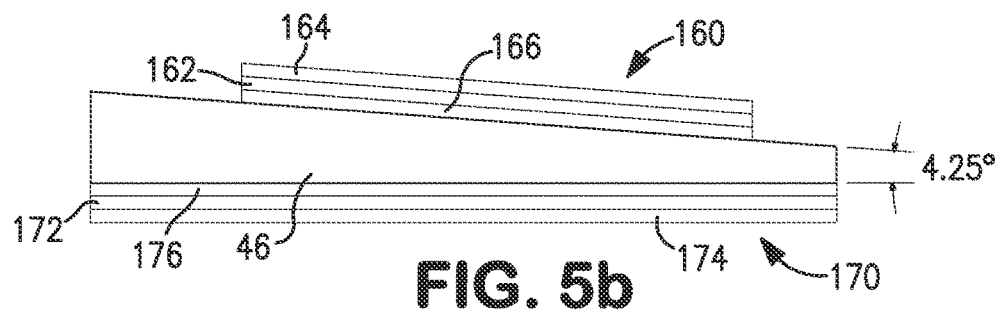
Figure 5C:
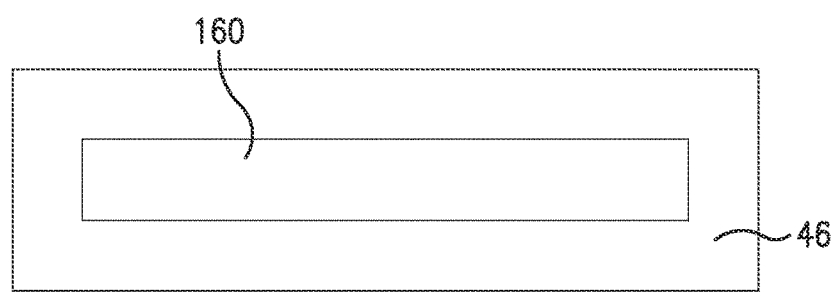
Figure 5D:
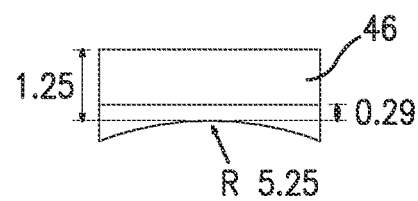

FIG. 4 is a perspective view of a schematic representation of another embodiment according to the present invention affixed to a top surface of a commercial or residential roof 42 comprising, for example, plural overlapping S-shaped, profile earthen/clay tiles 44. The module 100 (shown with reduced dimensions in FIG. 4 for clarity) is fixed to plural inserts 46, which are preferably disposed in an array (5 columns by 4 rows in this embodiment). As shown in FIGS. 5a, 5b, 5c, and 5d each insert 46 is preferably 13 inches long, by 4 inches wide, by 1.25 inches thick at the wide end—tapering down to 0.29 inch at the narrow end. Preferably, five of the six insert sides are flat, with the sixth (bottom) surface being downwardly curved into a concave shape to closely conform to the upper surface of the corresponding S-shaped tile 44.

One method of installation of the module 100 on a flat tile roof comprises applying layers of PSA 160, 170 (FIGS. 5b and 5c) tape to the top and bottom surfaces of the insert 46. Preferably, each tape layer 160, 170 comprises a suitable double-stick tape 162, 172, such as, for example but not limited to, a self-sealing tape having a formulation of resins, thermoplastics, curing rubbers, and non-curing rubbers. The double-stick tape has adhesive on both sides. When manufactured, the double-stick tape has a release layer 164,166 on each side to prevent adhesion. One release layer 166 is removed and the layer 166 is adhered to the insert 46. Then, the layer 164 is removed and the insert is adhered to the module at a common roof shingle course width, nominally about 13½ inches apart. The exposed adhesion side of the tape layer 172 is then positioned on and adhered to the roof. Thus, the module inserts 46 may be attached to the modules before shipping. Then, during installation of the module 100, the remaining release layer 174 is removed from the bottom surface of each insert so that the module can be adhered to the surface of an existing roof. The surface of the existing roof is cleaned and suitably prepared to receive the module 100. After installation, suitable pressure is applied to the upper layer 110 of the module 100 to permanently adhere the module to the surface of the roof. In one preferred embodiment, The PSA tape 160 preferably comprises plural Butyl tape. Tape size can be, but not limited to: 2×2, 2×3, 2×4, 2×5, 2×6, 2×7, 2×8, 2×9, 2×10, 2×11, 2×12 inches to 4×2, 4×4, 4×5, 4×6, 4×7, 4×8, 4×9, 4×10, 4×11, 4×12 inches. Preferably, the lower edge of the butyl tape is aligned approximately with the lower edge of each shingle course for installation, but the upper edge of the butyl tape may be spaced somewhat from the top edge of the module 100.

Alternatively, the double stick tape 162,172 may be applied to both the top and bottom surfaces of the modules 46 in the factory and shipped to a worksite in boxes, alongside the modules 100. In this installation method, the installer peels-and-sticks module inserts 46 in arrays similar to those shown in FIGS. 2 and 4. The top peel layers 164 are removed (either during insert placement or after), and the modules are then placed down on the insert arrays. Preferably, the module inserts 46 are positioned so that they fully support the weight and dimensions of the module 100 in FIG. 4.

Once the PV module is installed on the roof, the wiring/cabling/conduits/trays are installed by simply pressing them into/onto the clips. The wiring/cabling/conduits/trays are then connected, pulled taught, and run to the appropriate junction box. Another option is to run the J-box wires down under at least one edge of each module, and then run the wires under the module to the next module J-box connector. Another option is to mount the J-box on the backside of the module and run the wires from the J-box under the module to the next J-box connector.

Figure 6A:
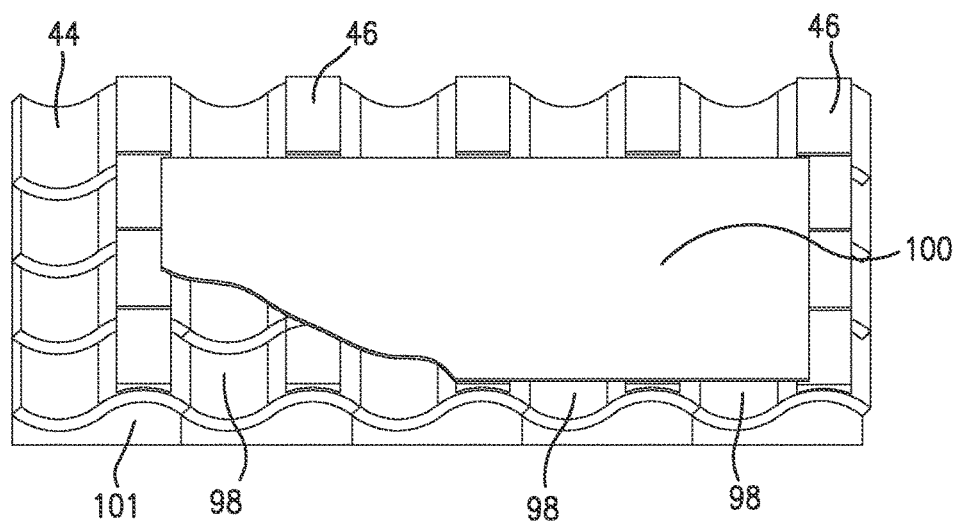
FIGS. 6a and 6b are, respectively, perspective and plan views of a birdstop according to another embodiment of the present invention.
Figure 6B:
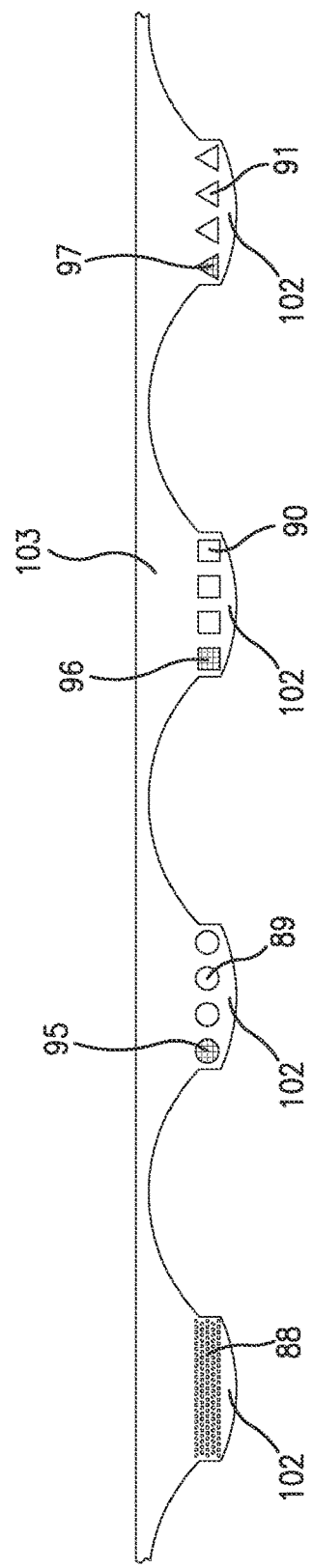

FIG. 6a is a front perspective view of the FIG. 4 embodiment showing the module 100 and a roof facia 101. A problem which may arise with such an installation is that birds, insects, and small mammals may enter into gaps 98 and nest underneath the modules 100. To prevent this, the present invention includes a birdstop 103 (FIG. 6b). The birdstop 103 is preferably mounted to the lower edge of one or more modules 100 along the bottom edges of the entire array of modules. A similar birdstop may also be mounted along the top edges of one or more of the array of modules. Alternatively, the birdstops may be mounted to the roof surface and/or the inserts 46. Preferably, the birdstops are made of plastic, but may also comprise metal, wood, shingle, clay, composite, etc. The birdstops 103 may be dyed and/or painted (for example, red) to match the color of the roof surface.

As best seen in FIG. 6b, the birdstop 103 may, for example, have 3, 4, 5, 6, 7, 8, or more downwardly-projecting stops 102. Each stop 102 may have one or more openings to permit flow of wind and/or water, while preventing ingress of birds, insects, and/or small mammals. As one example, all or a portion of each stop 102 may comprise a series of perforations 88, for example 3/32 inch diameter holes per square inch disposed uniformly across all or a portion of the birdstop, leaving approximately 22.8% of the birdstop surface as open. For example, any of the perforated metal sheeting products made by Clark Perforating Company, Inc., 15875 Allen Road, P.O. Box 179, Milan, Mich. 48160, see http://www.clarkperforating.com/perforated-metal-with-round-holes-tooling-to-36.html would be acceptable. As another example, all or a portion of each stop 102 may comprise circular (or oval) holes 89, which may or may not have mesh screen or netting 95 mounted on the inside or outside of the holes 89. The openings may comprise one or more square or rectangular openings 90, which may also be protected by mesh screen or netting 96. The right-most stop 102 shows triangular-shaped openings 91, which may also have mesh screen or netting 97. Any combination of the above-described (or alternative) opening may be used, depending on the types of pests to be blocked, the amount of rains, snow, and wind in the local area, etc.

Figure 7A:
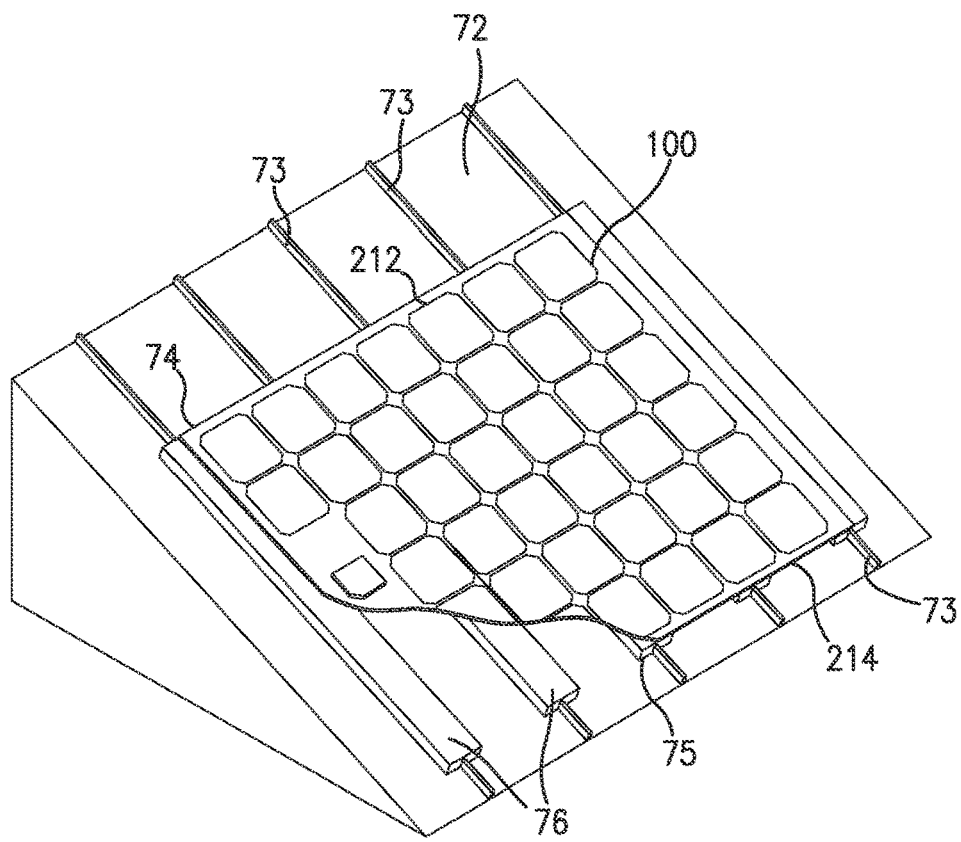
FIGS. 7a and 7b are, respectively, perspective and side plan views according to another embodiment of the present invention.
Figure 7B:
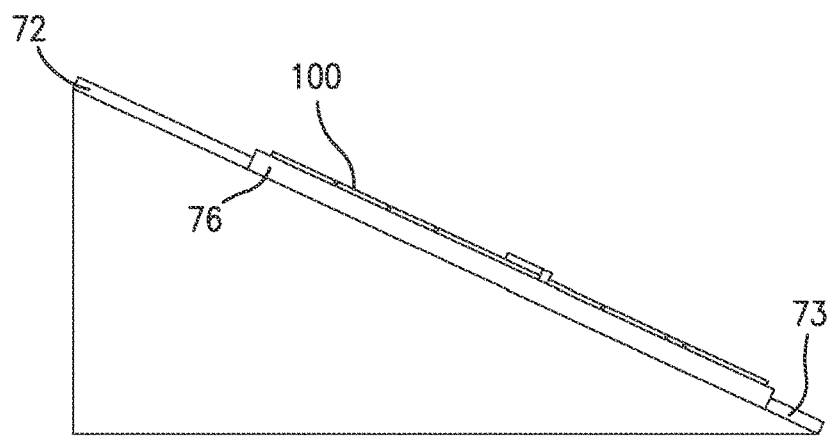

FIG. 7a is a perspective view of a schematic representation of another embodiment according to the present invention, fixed to a top surface of a commercial or residential roof comprising, for example, standing seam metal roof 72. The module 100 (shown with reduced dimensions in FIG. 7a for clarity) is fixed to plural inserts 76, which are preferably disposed parallel and on top of seams 73. Preferably, the inserts 76 have a channel on a bottom surface thereof which straddles the seam 73. Also preferably, since there are no overlapping tiles on such a roof, the inserts 76 may comprise a single foam rectangle with a rectangular cross-section. In this embodiment, the upper and lower edges 74 and 75 of each insert 76 may be coincident with the upper and lower edges 212 and 214 of the module 100, for a single-row installation. For more rows and columns, the insert edges may extend beyond the module edges, as described earlier. FIG. 7b is a side view of the FIG. 7a embodiment showing the bottom of the insert 76 contacting the roof surface while straddling the seam 73.

Figure 8A:
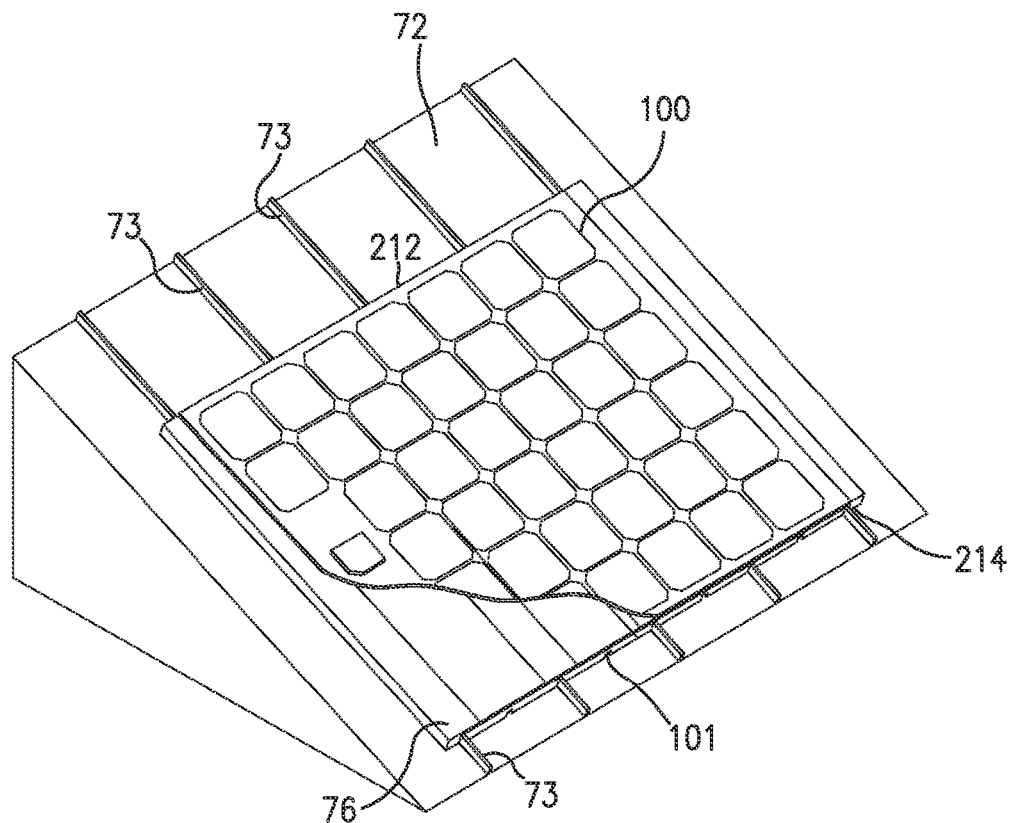
FIGS. 8a, 8b, and 8c are, respectively, perspective, side, and top plan views of solar module foam insert according to the FIG. 7a embodiment.
Figure 8B:
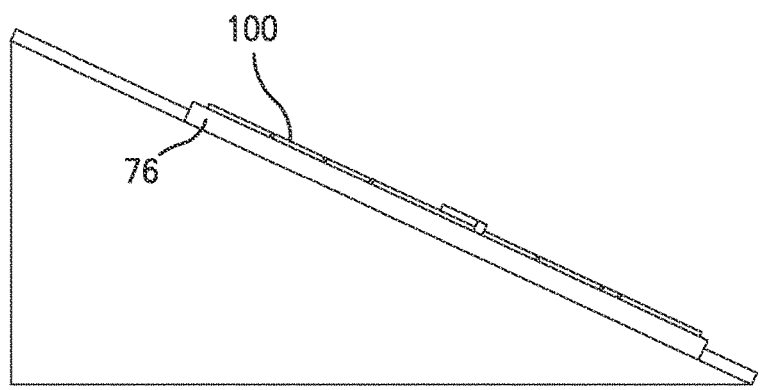
Figure 8C:
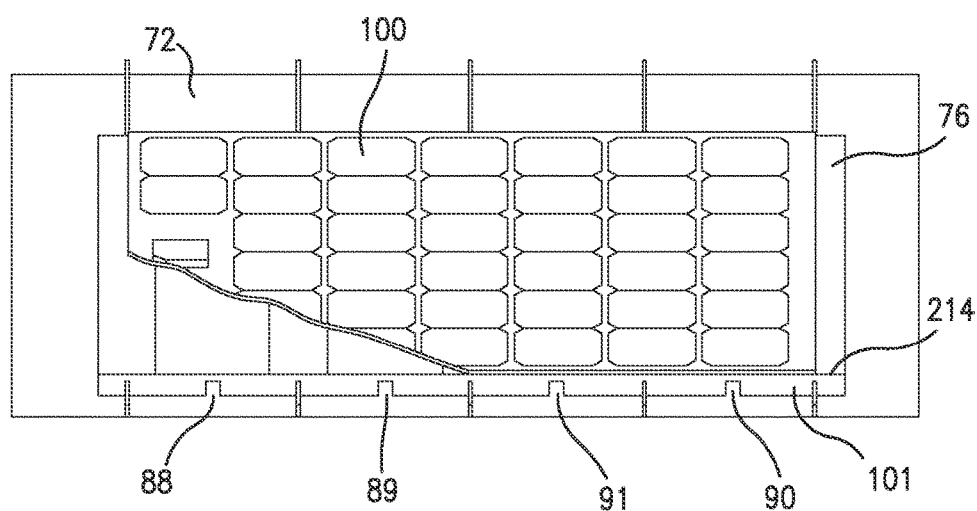
Figure 9A:
FIGS. 9a, 9b, 9c, and 9d, respectively, illustrate side, top plan, perspective views of the module inserts according to the FIG. 7a embodiment.
Figure 9B:
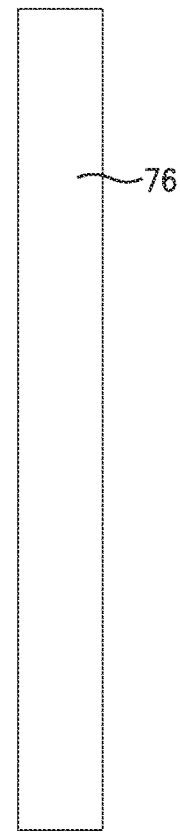
Figure 9C:
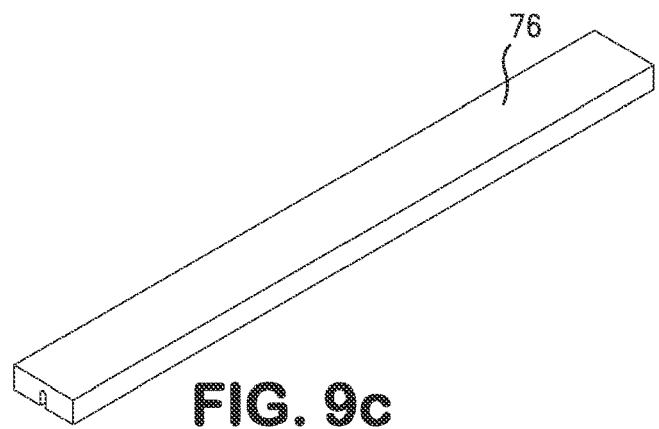
Figure 9D:
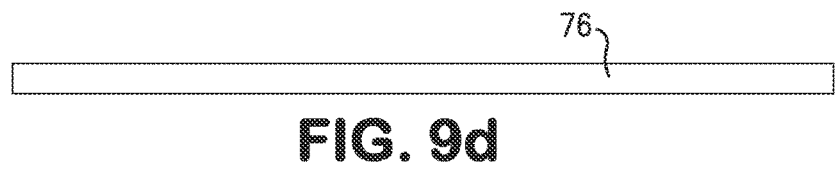

As shown in FIGS. 8a, 8b, and 8c, each insert 76 is preferably the same length (top-to-bottom of roof) as the module 100. In this preferred configuration (FIGS. 9a, 9b, 9c, and 9d), each insert 76 is 39 inches long, by 4 inches wide, by 1.5-2 inches thick, with a slot 79 vertical to the 4 inch wide surface and located in the middle of foam across full length of the foam. The width and depth of the slot 79 are preferably, but not limited to, 0.25 inch and 1 inch, respectively. Preferably, the foam has a flat 0.5 inch thick portion 91 on top of the slot. The module 100 (shown with reduced dimensions in FIG. 8a for clarity) is fixed to plural inserts 76 via (for example) double stick tape, which inserts are preferably disposed in an array. FIG. 8a shows the module 100 fixed to plural inserts 76 which are preferably disposed in a 1 row by 5 column array, preferably on every standing seam 73 under the module 100.

To prevent birds and other small animals nesting under the module1 100, bird stops 101 with modified profiles that fit between top of flat metal roof and bottom surface of the module 100 could be installed at the lower edge 214 and the top edge 212 of module 100, using adhesives or mechanical means, such as but not limited to, screws, clips, hook-and-fastener arrangements, etc. Preferably, the birdstop has one or more fluid openings 88 (oval), 89 (square and/or rectangle), 90 (circular), and/or 91 (triangular), or any combination of these and/or other desirable shapes, at or near the bottom crests 102 of the inverted birdstop 101 to allow egress of water, wind, and small debris. One or more of these openings may be covered by screen and/or mesh material to keep out insects also.

Figure 10A:
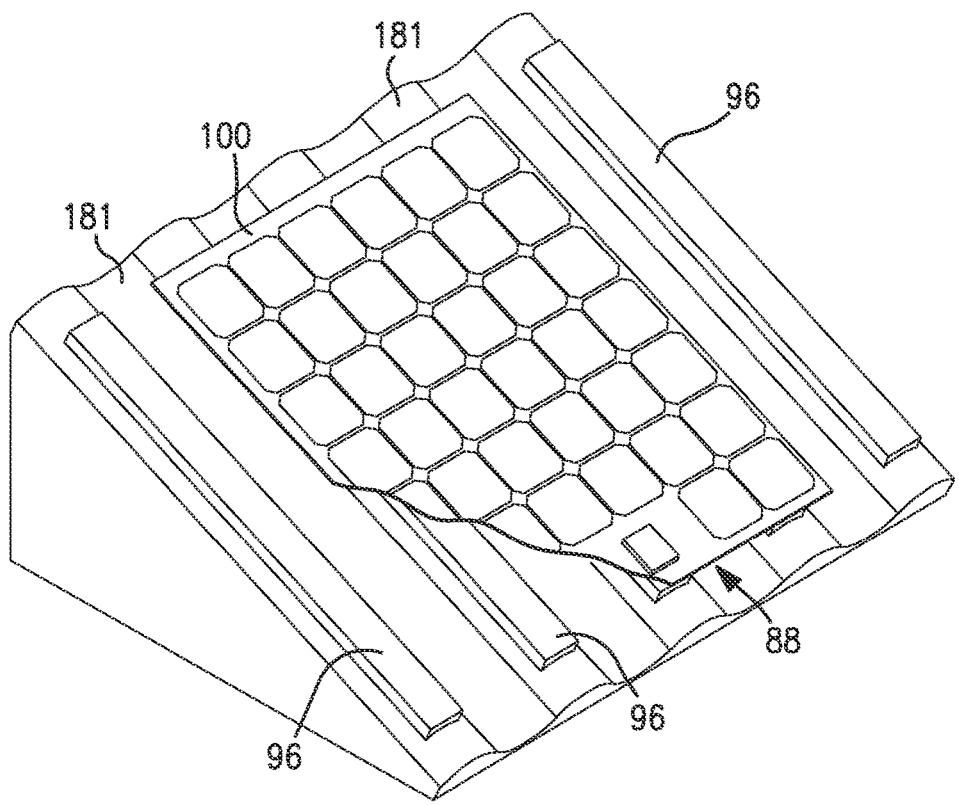
FIGS. 10a, 10b, and 10c show, respectively, perspective, side plan, and front perspective views of another embodiment according to the present invention.
Figure 10B:
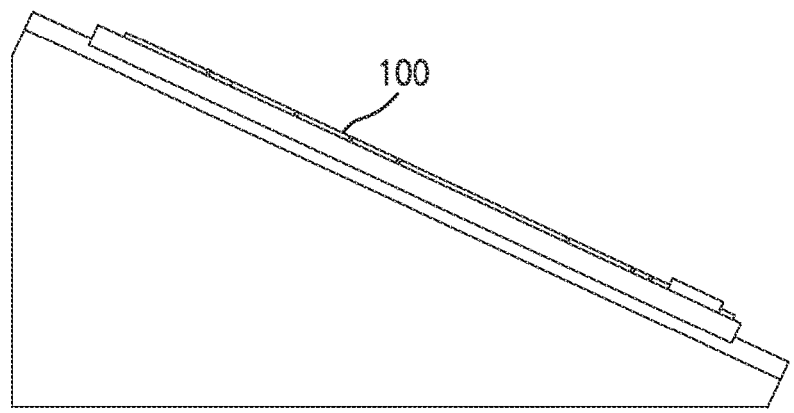
Figure 10C:
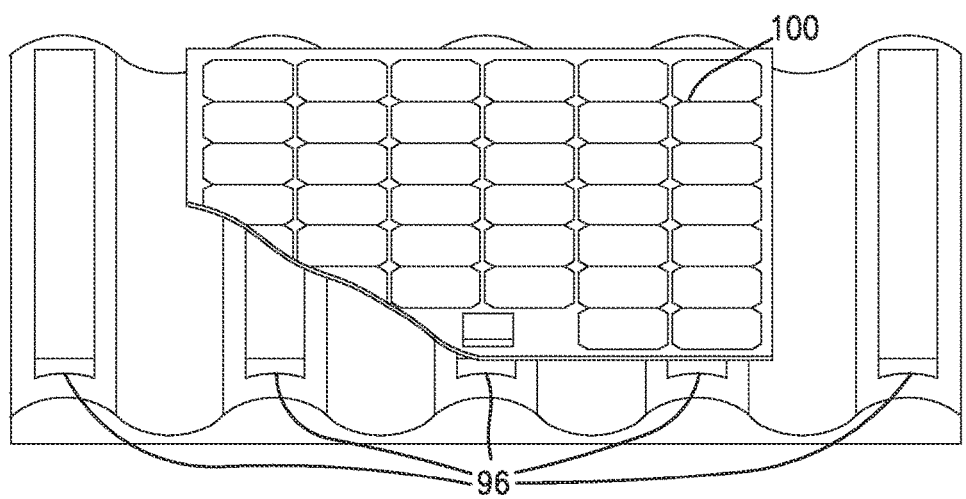

FIG. 10a is a perspective view of a schematic representation of another embodiment according to the present invention, fixed to a top surface of a commercial or residential roof 92 comprising, for example, corrugated roofs, such as but not limited to, metal roofs and fiber glass roofs. The module 100 (shown with reduced dimensions in FIG. 10a for clarity) is fixed to plural inserts 96, which are preferably disposed parallel and on top of the corrugated roof 181. As shown in FIGS. 12a, 12b, 12c, and 12d, each insert 96 is preferably the same length as the module 100. In this preferred configuration, the insert 96 is 39 inches long and by 4 inches wide. Preferably, five of the six insert sides are flat, with the sixth surface 131 being downwardly curved into a concave shape to closely conform to the upper surface of the corresponding corrugated roof 181.

Figure 11A:
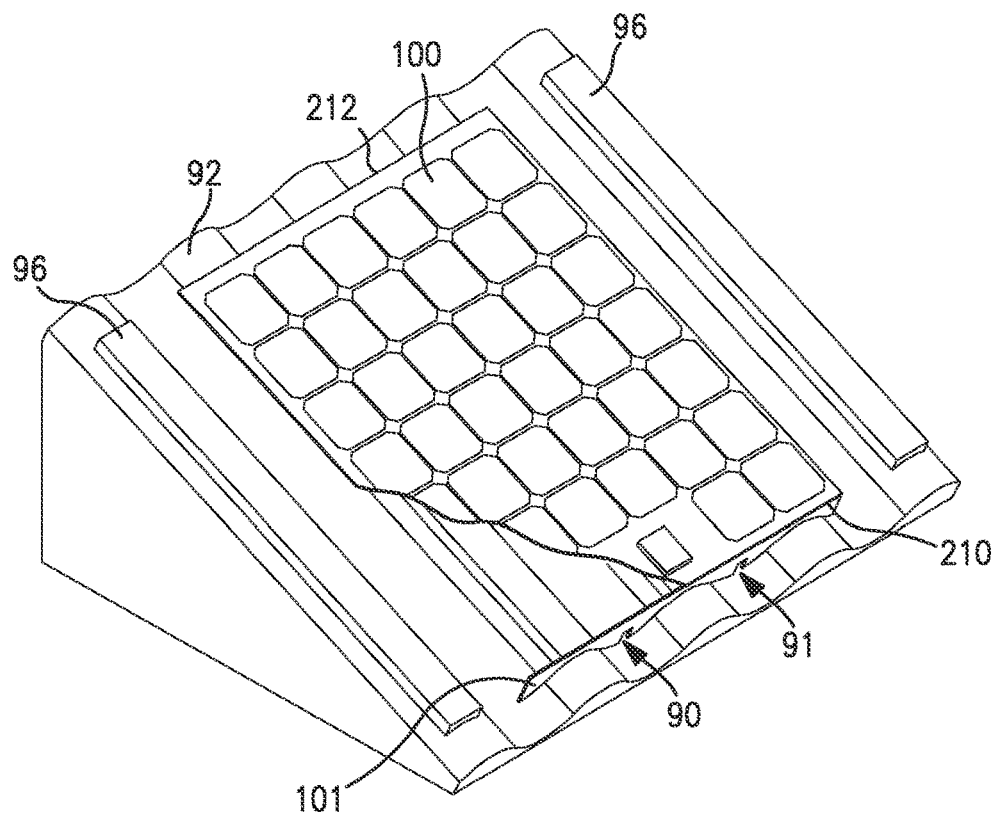
FIGS. 11a, 11b, and 11c are, respectively, perspective, side, and front perspective views of a solar module foam insert according to a further embodiment according to the present invention.
Figure 11B:
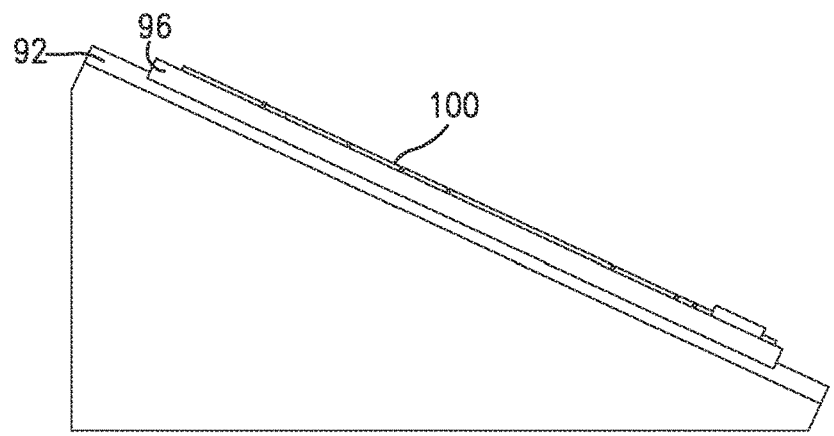
Figure 11C:
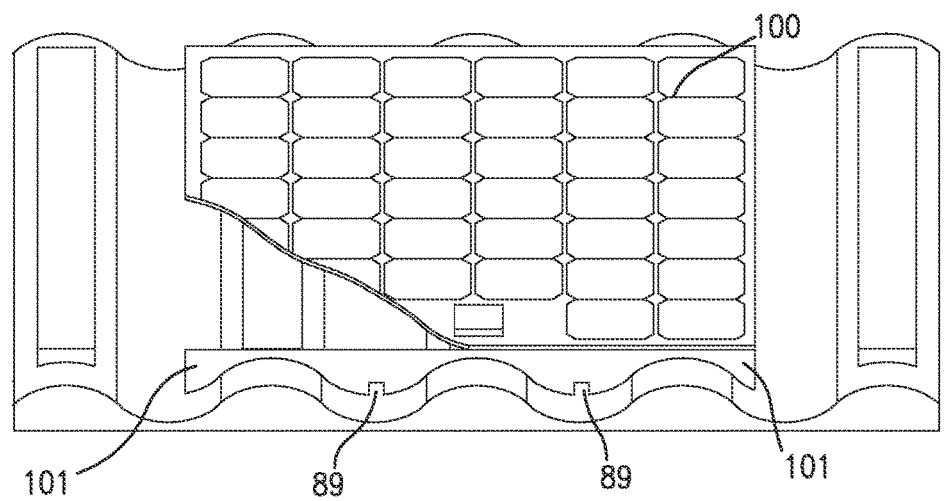

The module 100 is preferably fixed to plural inserts 96, which are preferably disposed in an array. FIGS. 11a and 11b show the module 100 is fixed to plural inserts 96, which are preferably disposed in an array on each upwardly-projecting top surface 92 of the corrugated roof under, the module 100. Alternatively, inserts 96 could be disposed on the top roof surface at pre-determined intervals on the corrugated roof. To prevent birds and other small animals nesting under the model 100, birdstops 101 with modified profiles that fit between top of the corrugated roof and the bottom of the module 100 could be installed at the lower edge 214 and the top edge 212 of the module 100, using adhesives or mechanical means, such as but not limited to, screws, clips, hook-and-fastener arrangements, etc. Preferably, the birdstop has one or more fluid openings 88 (oval), 89 (square and/or rectangle), 90 (circular), and/or 91 (triangular), or any combination of these and/or other desirable shapes, at or near the bottom crests 102 of the inverted birdstop 101 to allow egress of water, wind, and small debris. Screening and/or mesh may be provided to cover these holes to prevent ingress if insects.

The present invention is disclosed herein in terms of a preferred embodiment thereof, which provides an exterior building module as defined in the appended claims. Various changes, modifications, and alterations in the teachings of the present invention may be contemplated by those skilled in the art without departing from the intended spirit and scope of the appended claims. It is intended that the present invention encompass such changes and modifications.

What is claimed is:

1. A photovoltaic module, comprising
an upper transparent protective layer;
a photovoltaic layer positioned beneath the upper transparent protective layer, the photovoltaic layer comprising a plurality of electrically interconnected photovoltaic cells disposed in an array;

a rigid substrate layer positioned beneath the photovoltaic layer; and a plurality of inserts configured to be fixedly attached to (i) a bottom surface of the rigid substrate and (ii) a surface of a roof, the plurality of inserts being disposed in an array, each insert having a substantially triangular-shaped cross section when viewed from a side orthogonal to a line of a roof downward slope, each insert having a thickness to maintain the entire bottom surface of the rigid substrate at about one inch from the surface of the roof, each insert having a thickness in the down-roof direction which is thinner than a thickness in an up-roof direction, at least one insert supporting two adjacent photovoltaic modules.

2. The photovoltaic module according to claim 1, wherein a bottom surface of at least one insert is substantially flat.

3. The photovoltaic module according to claim 1, wherein a bottom surface of at least one insert is substantially curved in cross-section, when viewed from a bottom of the roof downward slope.

4. The photovoltaic module according to claim 1, further comprising double stick tape disposed between the bottom surface of the rigid substrate and a top surface of at least one insert.

5. The photovoltaic module according to claim 4, further comprising double stick tape disposed between a bottom surface of the at least one insert and the surface of the roof.

6. The photovoltaic module according to claim 1, wherein the array of inserts comprises at least a 1×2 array.

7. The photovoltaic module according to claim 6, wherein at least one space is provided between adjacent inserts in the direction of the line of the roof downward slope, the spaces being configured to allow water and wind to pass therethrough.

8. The photovoltaic module according to claim 1, wherein no portion of an insert of said plurality of inserts is visible from the direction orthogonal to the line of the roof downward slope.

9. The photovoltaic module according to claim 1, wherein each of the plurality of inserts comprises a foam insert.

10. The photovoltaic module according to claim 9, wherein each foam insert of the plurality of foam inserts has a rectilinear shape when viewed from a direction orthogonal to both the line of the roof downward slope and the side orthogonal thereto.

11. The photovoltaic module according to claim 1, wherein each of the plurality of inserts comprises a plastic insert.

12. The photovoltaic module according to claim 1, wherein each of the plurality of inserts comprises a concrete insert.

13. The photovoltaic module according to claim 1, wherein each of the plurality of inserts comprises a glass insert.

14. The photovoltaic module according to claim 1, wherein each of the plurality of inserts comprises a rock insert.

15. The photovoltaic module according to claim 1, wherein each of the plurality of inserts has a sufficient thickness configured so that no portion of the module touches any portion of the roof surface.

16. A photovoltaic module, comprising:

an upper transparent protective layer;

a photovoltaic layer positioned beneath the upper transparent protective layer, the photovoltaic layer comprising a plurality of electrically interconnected photovoltaic cells disposed in an array;

a rigid substrate layer positioned beneath the photovoltaic layer; and a plurality of inserts configured to be attached to (i) a bottom surface of the rigid substrate and (ii) a surface of a roof, the plurality of inserts being disposed in an array, each of the plurality of foam inserts having a substantially triangular-shaped cross section when viewed from a side orthogonal to a line of a roof downward slope, each insert having a thickness to maintain the entire bottom surface of the rigid substrate about one inch from the surface of the roof, at least one of the plurality of inserts being disposed to underlie two adjacent photovoltaic modules.

17. The photovoltaic module according to claim 16, wherein each insert insulates the photovoltaic layer from temperature and electrical variations.

18. The photovoltaic module according to claim 16, wherein the plurality of inserts is disposed in an array which allows for passage of wind and water between adjacent inserts in the direction of the roof downward slope.

19. The photovoltaic module according to claim 16, further comprising double stick tape disposed on at least one side of each of the plurality of inserts.

20. The photovoltaic module according to claim 16, further comprising a birdstop configured to be mounted to an upper and/or a lower edge of the rigid layer, the bird stop being configured to prevent ingress of bird beneath the rigid layer.

21. The photovoltaic module according to claim 16, wherein an upper row of inserts, among the plurality of inserts, is disposed such that upper portions of said upper row extend upward beyond an upper edge of the rigid layer.

22. The photovoltaic module according to claim 16, wherein each insert of the plurality of inserts has a length substantially equal to a roof-downward-slope length of the rigid layer.

23. The photovoltaic module according to claim 16, wherein at least one of the plurality of inserts is disposed so that its upper vertical edge is disposed to abut against a vertical edge of an overlapping upper roof tile.

24. The photovoltaic module according to claim 16, wherein each of the plurality of inserts has an upper edge vertical thickness of between about 0.5 inch and about 0.25 inch.

25. A photovoltaic module, comprising:

an upper transparent protective layer;

a photovoltaic layer positioned beneath the upper transparent protective layer, the photovoltaic layer comprising a plurality of electrically interconnected photovoltaic cells disposed in an array;

a rigid substrate layer positioned beneath the photovoltaic layer; and a plurality of inserts configured to be fixedly attached to (i) a bottom surface of the rigid substrate and (ii) a surface of a roof, the plurality of inserts being disposed in an array, each insert having a substantially triangular-shaped cross section when viewed from a side orthogonal to a line of a roof downward slope, and wherein each insert having a thickness to maintain the entire bottom surface of the rigid substrate at about one inch from the surface of the roof, wherein at least one of the plurality of inserts is disposed so that its lower vertical edge aligns with a lower vertical edge of an underlying roof tile, and wherein a double-stick tape is affixed to a bottom surface of the at least one of the plurality of inserts such that the lower vertical edge of the double-stick tape aligns with the lower edge of the at least one of the plurality of inserts.

\* \* \* \* \*